（12） United States Patent
Yasusaka

(10) Patent No.: US 10,359,795 B2
(45) Date of Patent: Jul. 23, 2019

(54) LINEAR POWER SOURCE

(71) Applicant: Rohm Co., Ltd., Kyoto (JP)

(72) Inventor: Makoto Yasusaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/868,083

(22) Filed: Jan. 11, 2018

(65) Prior Publication Data

US 2018/0203477 A1 Jul. 19, 2018

(30) Foreign Application Priority Data

Jan. 13, 2017 (JP) .................. 2017-003944

(51) Int. Cl.
*G05F 1/56* (2006.01)
*H03K 17/687* (2006.01)

(52) U.S. Cl.
CPC ............. *G05F 1/56* (2013.01); *H03K 17/687* (2013.01)

(58) Field of Classification Search
CPC . G05F 1/56; G05F 1/575; G05F 1/465; G05F 1/468; G05F 1/462; G05F 1/562; G05F 1/565; G05F 1/567; G05F 1/569; G05F 1/571; G05F 1/573; G05F 1/5735

USPC .................................... 323/273–281
See application file for complete search history.

(56) References Cited

U.S. PATENT DOCUMENTS

2014/0253069 A1* 9/2014 Utsunomiya ........... G05F 1/565
323/273
2015/0277458 A1* 10/2015 Suzuki ...................... G05F 1/56
323/280

FOREIGN PATENT DOCUMENTS

JP 2014-38541 A 2/2014

* cited by examiner

*Primary Examiner* — Nguyen Tran
(74) *Attorney, Agent, or Firm* — Fish & Richardson P.C.

(57) ABSTRACT

A linear power source includes: an output transistor connected between an input terminal of an input voltage and an output terminal of an output voltage; a driver configured to drive the output transistor so that the output voltage or a feedback voltage corresponding to the output voltage matches a predetermined reference voltage; and a depletion type NMOSFET configured to generate a drain current that decreases as the output voltage rises, and to add the drain current to a current to be boosted at startup.

10 Claims, 9 Drawing Sheets

LINEAR POWER SOURCE

CROSS-REFERENCE TO RELATED APPLICATION

This application is based upon and claims the benefit of priority from Japanese Patent Application No. 2017-003944, filed on Jan. 13, 2017, the entire contents of which are incorporated herein by reference.

TECHNICAL FIELD

The present disclosure relates to a linear power source.

BACKGROUND

In the related art, a linear power source (=a series regulator such as a low drop out (LDO) regulator) is used as a power source means of various devices.

Further, an example of the above-mentioned technology is disclosed in the related art.

In particular, the reduction of power consumption of the linear power source mounted on a device has been promoted in recent years according to low power consumption of the device.

In the related art, however, since driving current at the output stage of the linear power source is always reduced in order to decrease its power consumption, a startup time (=the time required until a target value is reached from the start of a rise of an output voltage) is prolonged.

SUMMARY

Some embodiments of the present disclosure provide a linear power source capable of achieving both a reduction in power consumption and reduction in startup time.

According to an embodiment of the present disclosure, a linear power source includes an output transistor connected between an input terminal of an input voltage and an output terminal of an output voltage, a driver configured to drive the output transistor so that the output voltage or a feedback voltage corresponding to the output voltage matches a predetermined reference voltage, and a depletion type NMOSFET configured to generate a drain current that decreases as the output voltage rises, and to add the drain current to a current to be boosted at startup.

In some embodiments, the depletion type NMOSFET is configured to add the drain current to a driving current of the driver.

In some embodiments, the depletion type NMOSFET has a drain connected to an output terminal of the driver, a source connected to the output terminal of the output voltage, and a gate connected to an application terminal of a constant voltage.

In some embodiments, the constant voltage is set to a voltage value at which a voltage between the gate and the source of the depletion type NMOSFET is equal to or greater than an on-threshold voltage when a rise of the output voltage starts.

In some embodiments, the constant voltage is a ground voltage.

In some embodiments, the constant voltage is a positive voltage.

In some embodiments, the positive voltage is a divided voltage generated by dividing the output voltage.

In some embodiments, the drain current becomes a zero value before the output voltage reaches a target value.

In some embodiments, the drain current continues to flow after the output voltage reaches a target value.

According to another embodiment of the present disclosure, a linear power source includes an output transistor connected between an input terminal of an input voltage and an output terminal of an output voltage, a driver configured to drive the output transistor so that the output voltage or a feedback voltage corresponding to the output voltage matches a predetermined reference voltage, and a depletion type NMOSFET configured to generate a drain current that decreases as the output voltage rises, and direct the drain current through the output terminal of the output voltage.

DETAILED DESCRIPTION

Figure 1A:
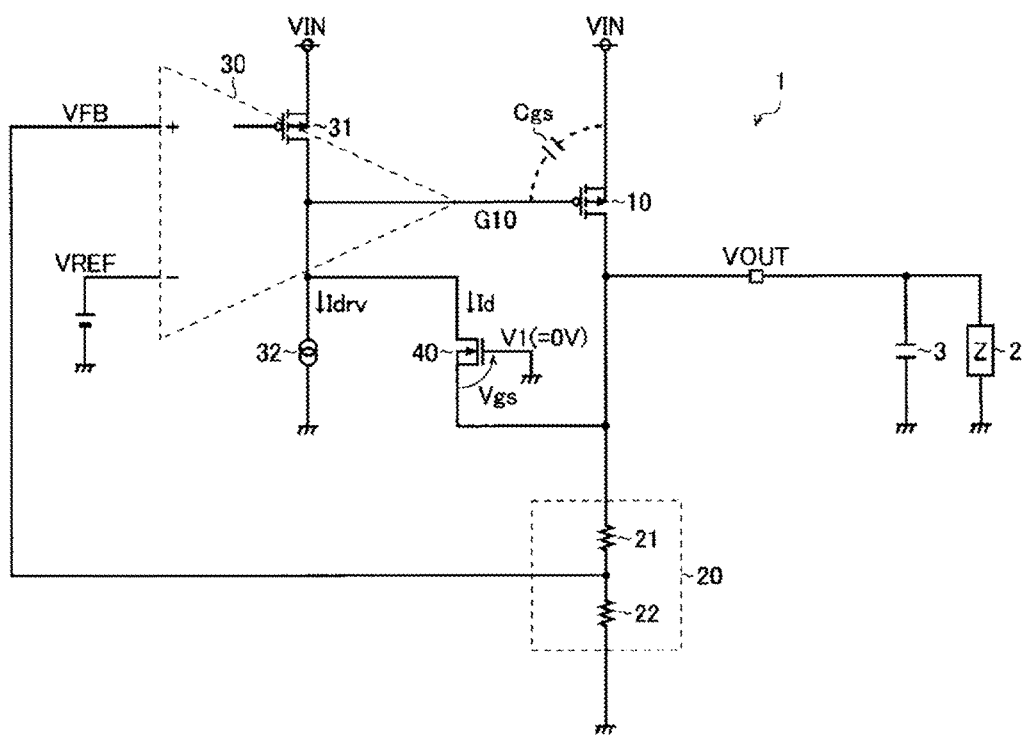
FIG. 1A is a diagram illustrating a linear power source according to a first embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

<First Embodiment>

FIG. 1A is a diagram illustrating a linear power source according to a first embodiment of the present disclosure. A linear power source 1 according to this embodiment includes an output transistor 10, an output voltage divider 20, a driver 30, and a depletion type NMOSFET (N-channel type metal oxide semiconductor field effect transistor) 40, and steps down an input voltage VIN to generate a desired output voltage VOUT. The output voltage VOUT is supplied to a load 2 (=a secondary power source, a microcomputer, or the like) in a subsequent stage. In addition, an output capacitor 3 for smoothing the output voltage VOUT may be connected in parallel between an output terminal of the output voltage VOUT and a ground terminal (=an application terminal of a ground voltage 0 V). The linear power source 1 may be used as, for example, a reference voltage source built in an IC. In this embodiment, the output voltage divider 20 may be integrated in an IC chip.

The output transistor 10 is connected between an input terminal of the input voltage VIN and the output terminal of the output voltage VOUT, and controls conductivity (in other words, an on resistance value) depending on a gate signal G10 from the driver 30. Furthermore, in the example of this drawing, a P-type MOSFET (PMOSFET) is used as the output transistor 10. Therefore, as the gate signal G10 lowers, the conductivity of the output transistor 10 gets higher. Thus, the output voltage VOUT rises. Conversely, the higher the gate signal G10 is, the lower the conductivity of the output transistor 10 becomes. Thus, the output voltage VOUT decreases.

The output voltage divider 20 includes resistors 21 and 22 (resistance values: R1 and R2) connected in series between the output terminal of the output voltage VOUT and the ground terminal, and outputs a feedback voltage VFB (=VOUT×{R2/(R1+R2)}) corresponding to the output voltage VOUT from a connection node between the two resistors. However, if the output voltage VOUT is within an input dynamic range of the driver 30, the output voltage divider 20 may be omitted and the output voltage VOUT may be directly input to the driver 30.

The driver 30 generates the gate signal G10 so that the feedback voltage VFB input to a non-inverting input terminal (+) matches a predetermined reference voltage VREF input to an input to inverting input terminal (−), and drives the output transistor 10. The driver 30 includes a PMOSFET 31 and a current source 32 as circuit elements constituting its output stage.

The PMOSFET 31 is connected between the input terminal of the input voltage VIN and a gate of the output transistor 10, and the conductivity is controlled depending on a difference value ΔV (=VFB−VREF) between the feedback voltage VFB and the reference voltage VREF. Specifically, the higher the difference value ΔV is, the higher the conductivity of the PMOSFET 31 becomes. Thus, the gate signal G10 rises. Conversely, the lower the difference value ΔV is, the lower the conductivity of the PMOSFET 31 becomes. Thus, the gate signal G10 decreases.

The current source 32 is connected between the gate of the output transistor 10 and the ground terminal, and generates a driving current Idrv of the driver 30. In some embodiments, the driving current Idrv of the driver 30 that flows normally may be reduced to be as small as possible in order to reduce the power consumption of the linear power source 1.

The depletion type NMOSFET 40 functions as a current booster which generates a drain current Id that decreases as the output voltage VOUT rises, and adds the drain current to a current to be boosted (the driving current Idrv of the driver 30 in this drawing) at startup. Regarding its connection relationship, the depletion type NMOSFET 40 has a drain connected to the output terminal of the driver 30 (specifically, the output terminal of the current source 32 that generates the driving current Idrv), a source connected to the output terminal of the output voltage VOUT, and a gate connected to an application terminal of the constant voltage V1 (the ground voltage 0V in this drawing).

Figure 1B:
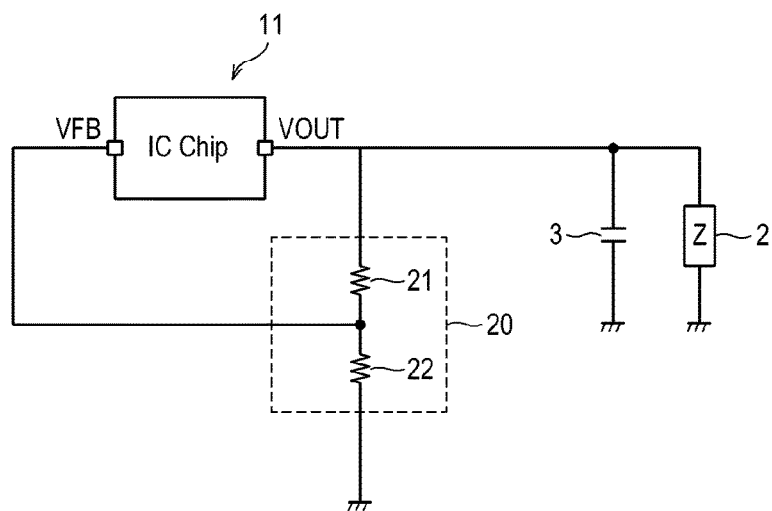
FIG. 1B is a diagram illustrating a linear power source according to a variation example to the first embodiment

FIG. 1B is a diagram illustrating a linear power source according to a variation example to the first embodiment. In this example, the output voltage divider 20 may be arranged outside of an IC chip 11 that includes other components of the linear power source 1, i.e., an output transistor 10, a driver 30, and a depletion type NMOSFET (N-channel type metal oxide semiconductor field effect transistor) 40. As illustrated in FIG. 1B, a terminal of the output voltage divider 20 is connected to a VOUT terminal of the output voltage, which is also connected to a capacitor 3 and a load 2. Another terminal of the output voltage divider 20 is connected to a ground terminal. In addition, a connection node between two registers 21 and 22 in the output voltage divider 20 is connected to a VFB terminal of the IC chip 11, which is connected to a positive terminal of the driver 30 in the IC chip. The components of the linear power source 1 in the IC chip 11 operate in the same manner as those in FIG. 1A.

Hereinafter, the significance of introducing the depletion type NMOSFET 40 will be described in detail.

Figure 2:
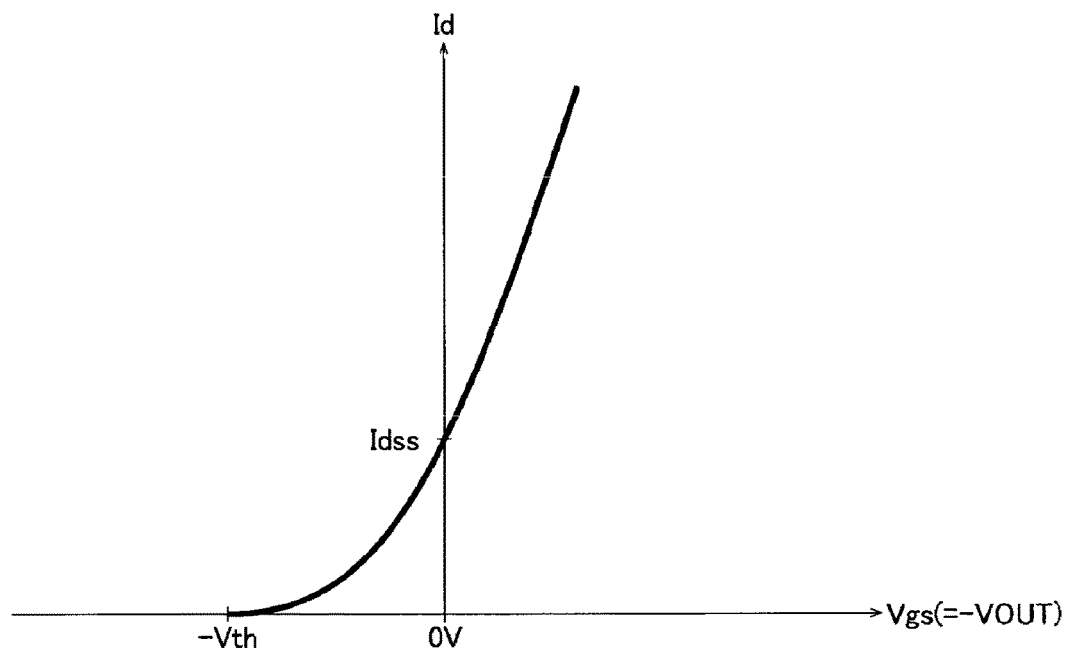
FIG. 2 is an Id-Vgs characteristic diagram of a depletion type NMOSFET.

FIG. 2 is an Id-Vgs characteristic diagram of the depletion type NMOSFET 40. As illustrated, the depletion type NMOSFET 40 has a negative on-threshold voltage (=−Vth), and even if its gate-source voltage Vgs (=V1−VOUT) is 0 V, a positive drain current Id (a so-called drain saturation current Idss) can flow.

In view of the above characteristics, in order to make the depletion type NMOSFET 40 function as a current booster, it can be seen that the constant voltage V1 may be set to a proper voltage value (for example, V1=0 V) so that the gate-source voltage Vgs of the depletion type NMOSFET 40 becomes equal to or greater than the on-threshold voltage (−Vth) when the output voltage VOUT starts to rise (VOUT=0 V).

Figure 3:
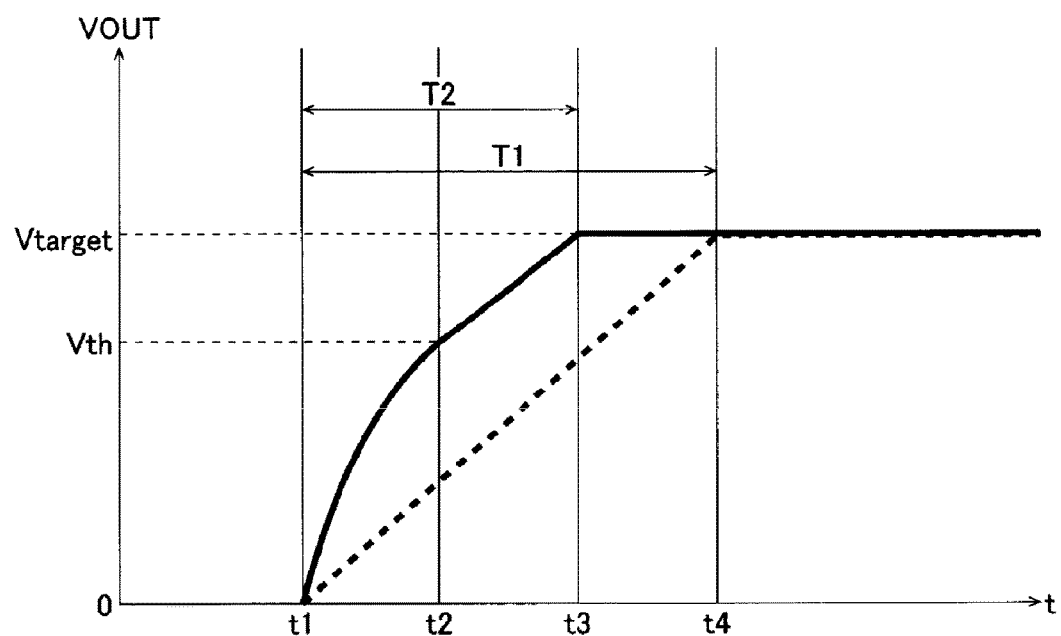
FIG. 3 is a time chart illustrating a rise behavior of an output voltage in the first embodiment.

FIG. 3 is a time chart illustrating characteristics of an increase in the output voltage VOUT in the first embodiment (V1=0 V). In this drawing, the solid line indicates a behavior with the current booster, and the small broken line indicates a behavior (a behavior in the related art) without a current booster.

When the linear power source 1 starts up at time t1, the output voltage VOUT starts to rise from around 0 V. Here, when the VOUT=0 V, the gate-source voltage Vgs (=−VOUT) of the depletion type NMOSFET 40 also becomes 0 V.

However, as described above, the depletion type NMOSFET 40 has a negative on-threshold voltage (=−Vth), and even if the gate-source voltage Vgs is 0 V a positive drain current Id can flow.

Thus, when the linear power source 1 starts up, since the driving current flowing through the output terminal of the driver 30 can be increased to (Idrv+Id), the gate signal G10 can be quickly lowered, and in turn, the rise of the output voltage VOUT can be accelerated.

In particular, when a large parasitic capacitance Cgs is added between the gate and source of the output transistor 10, the introduction of the depletion type NMOSFET 40 is effective.

Thereafter, when the output voltage VOUT rises and the gate-source voltage Vgs (=−VOUT) of the depletion type NMOSFET 40 becomes lower than the on-threshold voltage (=−Vth) at time t2, the depletion type NMOSFET 40 is turned off. Thus, the drain current Id becomes zero. As a result, after time t2, only the driving current Idrv generated by the current source 32 flows through the output terminal of the driver 30, and rate of increase of the output voltage VOUT (the slope of the solid line) is equal to that of the behavior (=the slope of the small broken line) in the related art.

Furthermore, FIG. 3 illustrates a startup time of the linear power source 1 (=the time required until the output voltage VOUT reaches the target value Vtarget from an initial value 0V when the output voltage VOUT starts rising) is shortened from "T1 (=t4−t1)" in the related art to "T2 (=t3−t1)" by the current boost operation from time t1 to time t2.

As described above, if the current boost operation is configured to perform only when the linear power source 1 is started up using the depletion type NMOSFET 40, the startup time of the linear power source 1 can be shortened without unnecessarily increasing the current consumption during normal operation of the linear power source 1.

Moreover, according to the linear power source 1 of the present embodiment, the aforementioned current boost operation may also be realized merely by adding one depletion type NMOSFET 40 to an existing circuit with proven performance.

<Second Embodiment>

Figure 4A:
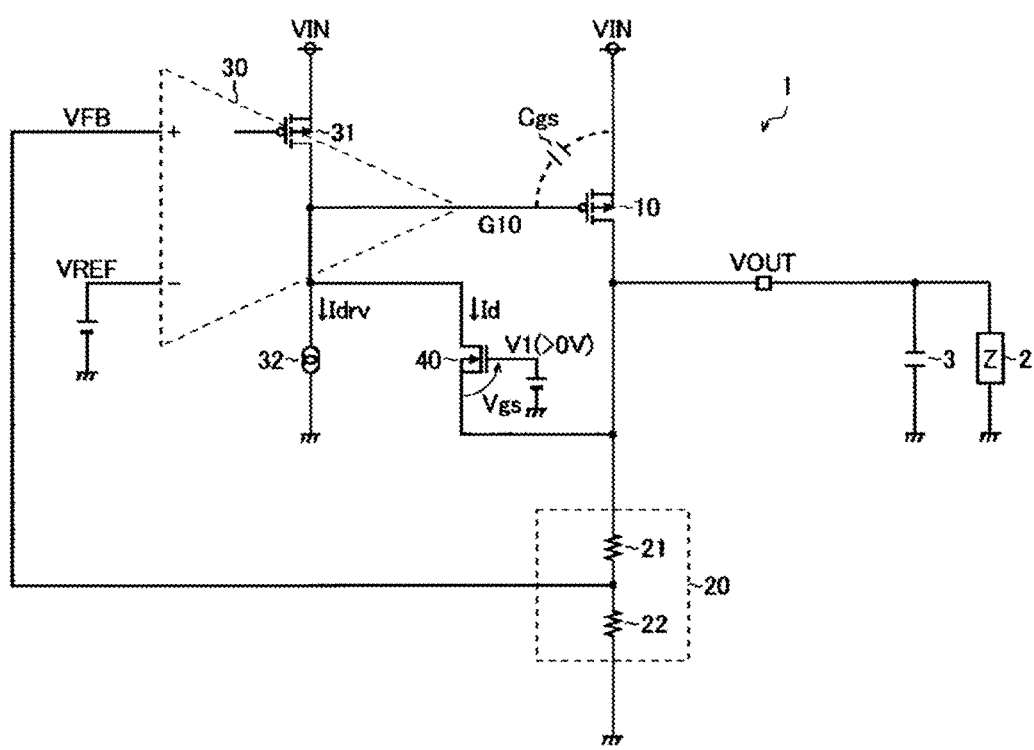
FIG. 4A is a diagram illustrating a linear power source according to a second embodiment of the present disclosure.

FIG. 4A is a diagram illustrating a linear power source according to a second embodiment of the present disclosure. A linear power source 1 according to the present embodiment has a configuration in which a positive constant voltage V1 (>0 V) is applied to the gate of the depletion type NMOSFET 40, based on the first embodiment (FIG. 1A) described above. In this embodiment, the output voltage divider 20 may be integrated in an IC chip.

Figure 4B:
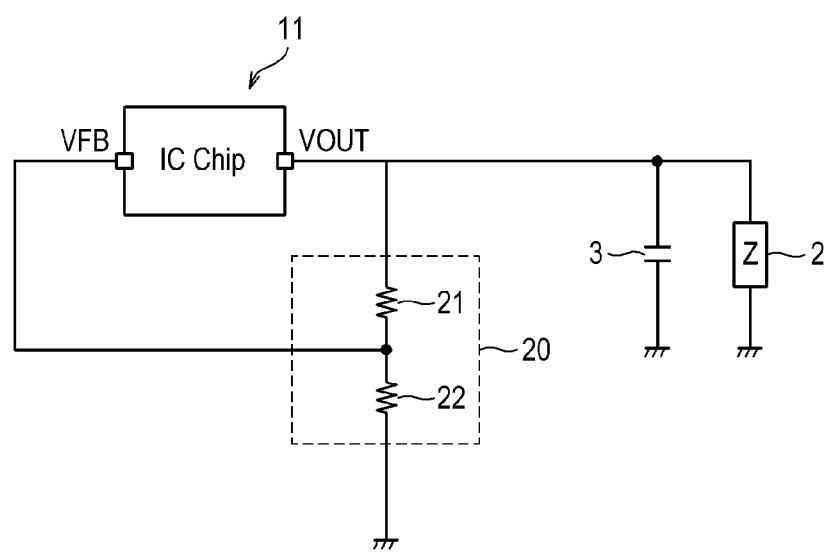
FIG. 4B is a diagram illustrating a linear power source according to a variation to the second embodiment

FIG. 4B is a diagram illustrating a linear power source according to a variation example to the second embodiment. In this example, the output voltage divider 20 may be arranged outside of an IC chip 11 that includes other components of the linear power source 1, i.e., an output transistor 10, a driver 30 and a depletion type NMOSFET (N-channel type metal oxide semiconductor field effect transistor) 40. As illustrated in FIG. 4B, a terminal of the output voltage divider 20 is connected to a VOUT terminal of the output voltage, which is also connected to a capacitor 3 and a load 2. Another terminal of the output voltage divider 20 is connected to a ground terminal. In addition, a connection node between two registers 21 and 22 in the output voltage divider 20 is connected to a VFB terminal of the IC chip 11, which is connected to a positive terminal of the driver 30 in the IC chip. The components of the linear power source 1 in the IC chip 11 operate in the same manner as those in FIG. 4A.

Figure 5:
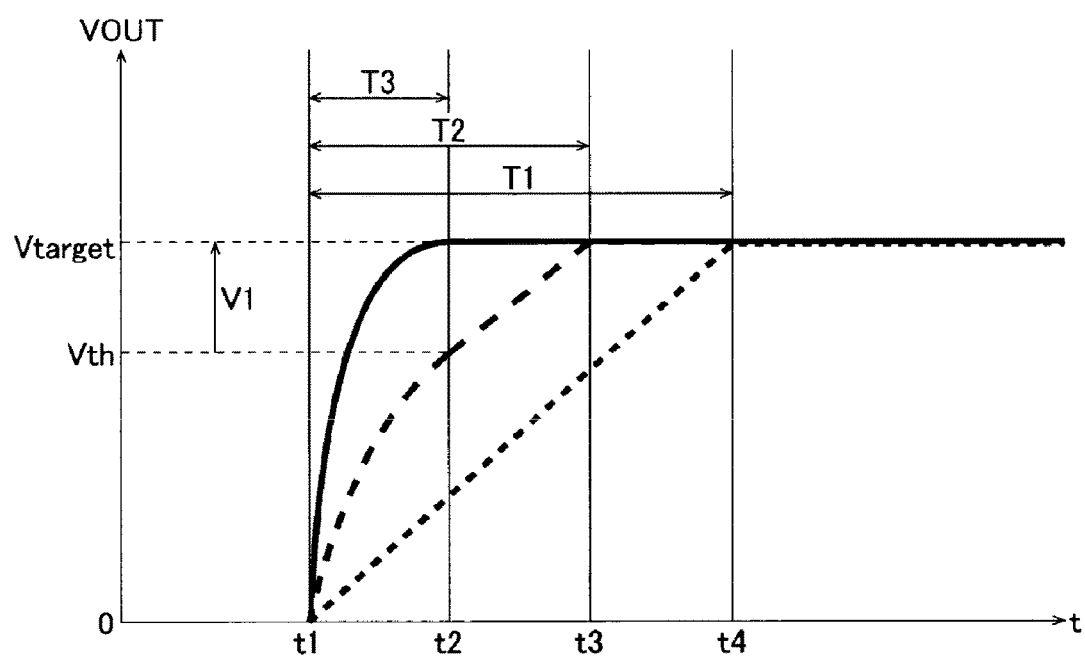
FIG. 5 is a time chart illustrating a rise behavior of an output voltage in the second embodiment

FIG. 5 is a time chart illustrating an increase in an output voltage VOUT in the second embodiment. In FIG. 5, the solid line indicates the behavior of the second embodiment (V1>0 V), the large broken line indicates the behavior of the first embodiment (V1=0 V), and the small broken line indicates the behavior without a current booster (the behavior in the related art).

According to the linear power source 1 of the present embodiment, the depletion type NMOSFET 40 is not turned off until VOUT>Vth+V1. That is, the OFF timing of the depletion type NMOSFET 40 can be arbitrarily adjusted depending on a voltage value of the constant voltage V1.

Moreover, according to the linear power source 1 of the present embodiment, since the gate-source voltage Vgs of the depletion type NMOSFET 40 on startup becomes a positive voltage (>0 V), the drain current Id during the current boost operation becomes larger than that of the first embodiment (see FIG. 2). Thus, the output voltage VOUT may rise more quickly than in the first embodiment.

In addition, in the example of FIG. 5, the voltage value of the constant voltage V1 is set so that Vth+V1=Vtarget. By setting the voltage value in this way, the drain current Id can continue to flow until the output voltage VOUT reaches the target value $V_{target}$. Thus, unlike the first embodiment (large broken line), since the current boost operation is not completed during the rise of the output voltage VOUT, it is possible to maximize an effect of the current boost operation.

In particular, in the example illustrated in FIG. 5, the startup time of the linear power source 1 is further shortened from "T2 (=t3−t1)" of the first embodiment to "T3 (=t2−t1)" by the optimization of the constant voltage V1 (V1=Vtarget−Vth).

(Third Embodiment)

Figure 6:
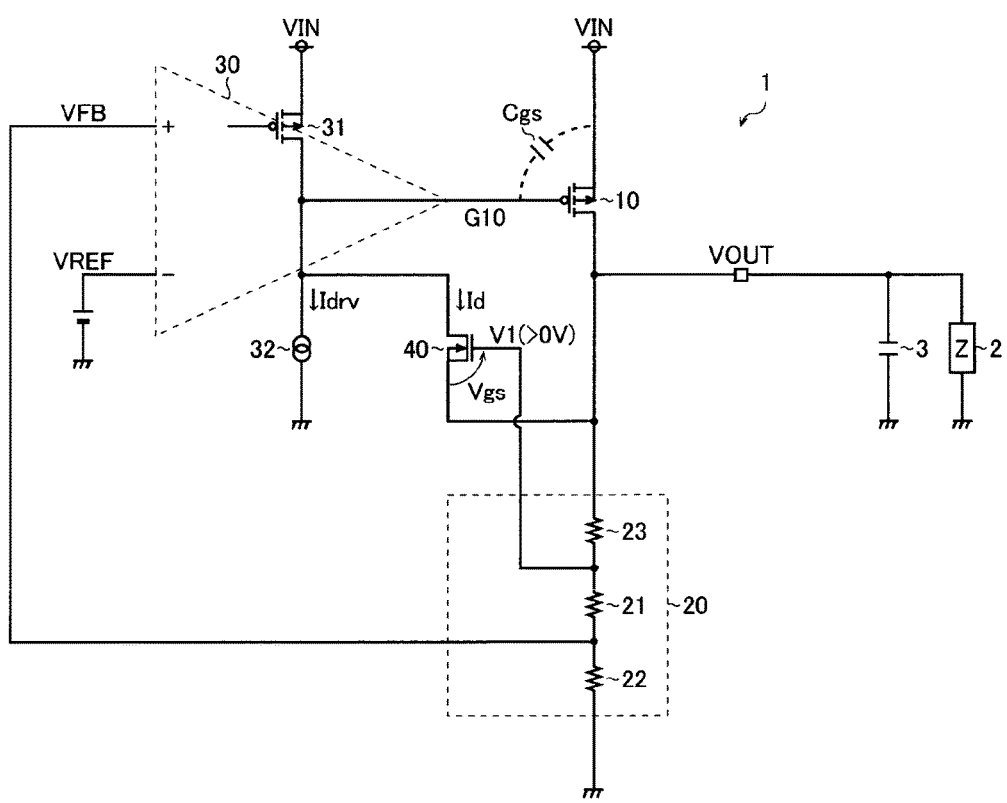
FIG. 6 is a diagram illustrating a linear power source according to a third embodiment of the present disclosure.

FIG. 6 is a diagram illustrating a third embodiment of a linear power source. The linear power source 1 according to the present embodiment has a configuration in which a divided voltage (=VOUT×{(R1+R2)/(R1+R2+R3)}) generated by dividing the output voltage VOUT by adding a resistor 23 (resistance value: R3) to the output voltage divider 20 is applied as a positive constant voltage V1 to the gate of the depletion type NMOSFET 40, based on the second embodiment (FIGS. 4A and 4B) described above.

By adopting this configuration, it is possible to apply the positive constant voltage V1 to the gate of the depletion type NMOSFET 40 merely by adding one resistor 23 without separately preparing a power source.

Furthermore, according to the linear power source 1 of the present embodiment, it may be expressed as Vgs=−α× VOUT (where a voltage division ratio α={R3/(R1+R2+R3)}).

Therefore, if the voltage division ratio α is set so as to satisfy α≤Vth/Vtarget, the drain current Id becomes zero at least before the output voltage VOUT reaches the target value Vtarget. Thus, the normal operation of the linear power source 1 is completed without unnecessarily increasing current consumption during normal operation.

Conversely, if the voltage division ratio α is set so as to satisfy α>Vth/Vtarget, the drain current Id continues to flow without reaching zero even after the output voltage VOUT reaches the target value Vtarget. As such, it is not necessary to fully turn off the depletion type NMOSFET 40 during normal operation of the linear power source 1, and the reduced drain current Id instead of the driving current Idrv (or together with the driving current Idrv) may continue to flow through the output terminal of the driver 30. When this configuration is adopted, since the current source 32 may be omitted as necessary, it is possible to reduce the circuit scale of the linear power source 1.

<Fourth Embodiment>

Figure 7:
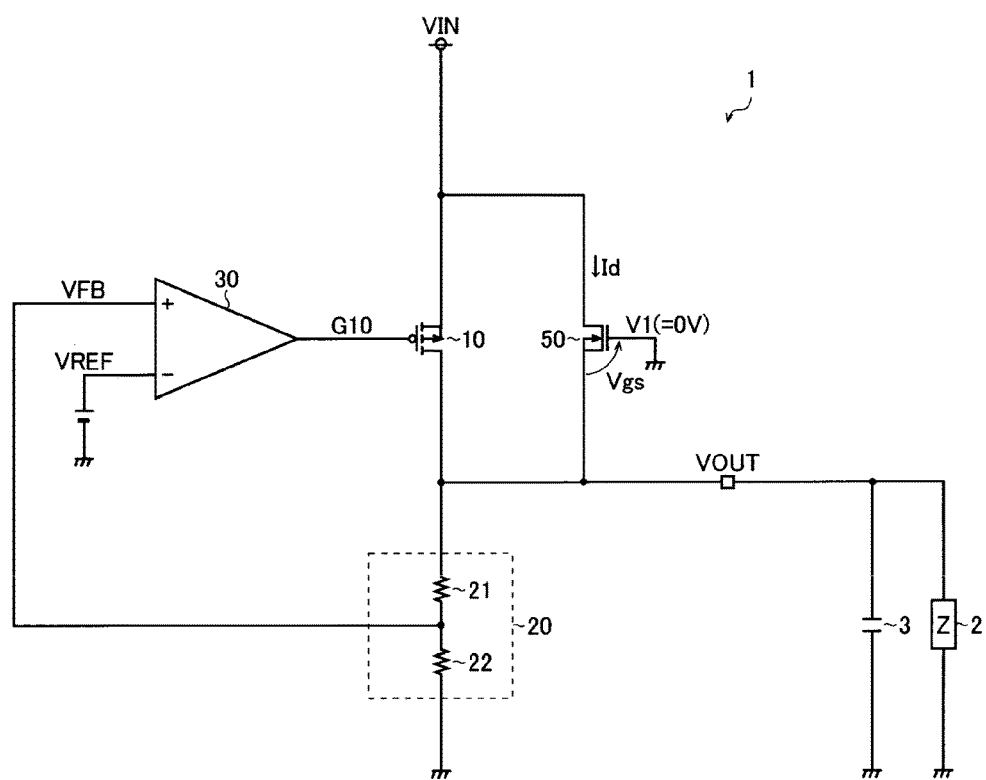
FIG. 7 is a diagram illustrating a linear power source according to a fourth embodiment of the present disclosure.

FIG. 7 is a diagram illustrating a linear power source according to a fourth embodiment of the present disclosure. A linear power source 1 according to the present embodiment has a configuration in which it includes a depletion type NMOSFET 50 in parallel with the output transistor 10, instead of the depletion type NMOSFET 40 functioning as the current booster of the driver 30, based on the first to third embodiments (FIGS. 1A and 1B, FIGS. 4A and 4B, and FIG. 6) described above.

The depletion type NMOSFET 50 functions as an output booster which generates a drain current Id that decreases as the output voltage VOUT rises and directs the drain current Id through the output terminal of the output voltage VOUT, thereby directly raising the output voltage VOUT. The depletion type NMOSFET 50 has a drain connected to the input terminal of the input voltage VIN, a source connected to the output terminal of the output voltage VOUT, and a gate connected to the application terminal of the constant voltage V1 (the ground voltage 0V depicted in FIG. 7).

For example, when the load 2 is light (=when the load 2 is high impedance and the current flowing through the load 2 is small), the output voltage VOUT can also be directly raised using the depletion type NMOSFET 50, as illustrated in this embodiment.

Furthermore, in the present embodiment, although a configuration in which the depletion type NMOSFET 50 is installed instead of the depletion type NMOSFET 40 of the first to third embodiments is illustrated as an example, both the depletion type NMOSFETs 40 and 50 may be installed.

<Applications to Vehicle>

Figure 8:
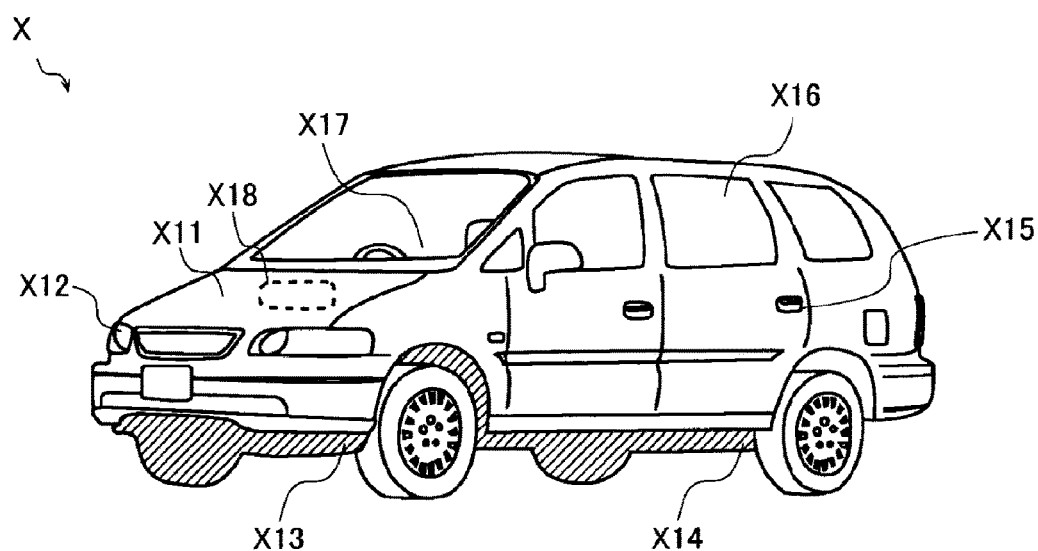
FIG. 8 is an external view of a vehicle.

FIG. 8 is an external view of a vehicle X. The vehicle X of this configuration example is equipped with various electronic devices X11 to X18 that operate by receiving a power source voltage supplied from a battery (not shown). Furthermore, the installation positions of the electronic devices X11 to X18 in FIG. 8 may be different from the actual positions for convenience of illustration.

The electronic device X11 is an engine control unit that performs engine-related controls (injection control, electronic throttle control, idling control, oxygen sensor heater control, auto cruise control, and the like).

The electronic device X12 is a lamp control unit that performs lighting-on-and-off control such as a high intensity discharged lamp (HID) or a daytime running lamp (DRL).

The electronic device X13 is a transmission control unit that performs transmission-related control.

The electronic device X14 is a braking unit that performs controls (anti-lock brake system (ABS) control, electric power steering (EPS) control, electronic suspension control, and the like) relating to the motion of the vehicle X.

The electronic device X15 is a security control unit that performs driving control such as a door lock or a security alarm.

The electronic device X16 is a standard equipment such as a wiper, an electric door mirror, a power window, a damper (shock absorber), an electric sunroof, an electric seat or the like, or an electronic device incorporated in the vehicle X at the factory shipment stage as an option item of a manufacturer.

The electronic device X17 is an electronic device that is arbitrarily mounted on the vehicle X as a user option item such as an in-vehicle audio/visual (A/V) device, a car navigation system, or an electronic toll collection system (ETC).

The electronic device X18 is an electronic device including a high voltage resistant motor such as an in-vehicle blower, an oil pump, a water pump, a battery cooling fan, or the like.

In addition, the linear power source 1 described above can be incorporated in any of the electronic devices X 11 to X 18.

Figure 9:
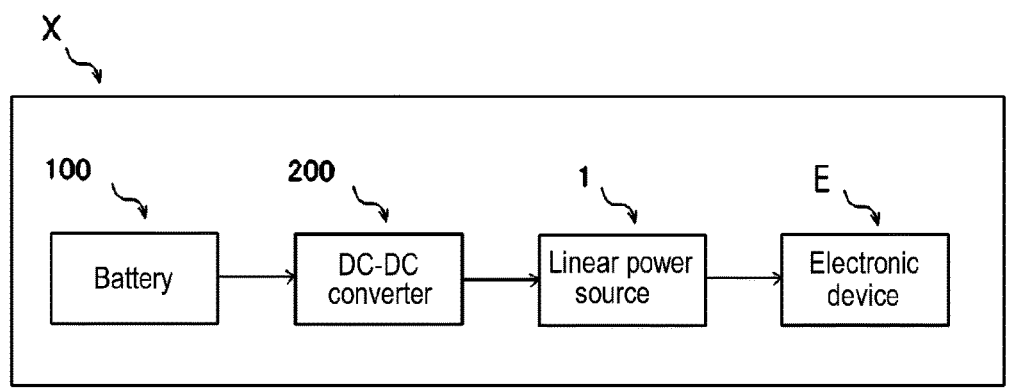
FIG. 9 illustrates a linear power source installed in the vehicle

FIG. 9 illustrates a linear power source 1 installed in the vehicle X. As illustrated, the vehicle X includes a battery 100, a DC-DC converter 200, and an electronic device E. The electronic device E may be any of the electronic devices X11 to X18 illustrated in FIG. 8. The battery 100 outputs a source voltage to the DC-DC converter 200. The DC-DC converter 200 then converts the source voltage and outputs a voltage, for example 12V. The outputted voltage of the DC-DC converter 200 is inputted to the linear power source 1. Further, the linear power source 1 is connected to the electronic device to provide electric power.

<Other Modifications>

Furthermore, various technical features disclosed herein may be differently modified without departing from the gist of the technical creation of the disclosure, in addition to the aforementioned embodiments. That is, the aforementioned embodiments should be considered as illustrative rather than as restrictive in all respects, and the technical scope of the present disclosure is not limited to the description of the aforementioned embodiments but is indicated by the scope of claims and should be understood to include all modifications within the meaning and range equivalent to the scope of claims.

The present disclosure disclosed herein can be used for vehicle-related devices, ship related devices, office devices, portable devices, smartphones, and the like.

According to the embodiments disclosed in the present disclosure, it is possible to provide a linear power source capable of achieving both reduction in power consumption and reduction in startup time.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A linear power source, comprising:
an output transistor connected between an input terminal of an input voltage and an output terminal of an output voltage;
a driver configured to drive the output transistor so that the output voltage or a feedback voltage corresponding to the output voltage matches a predetermined reference voltage; and
a depletion type NMOSFET configured to:
at startup of the output voltage, generate a drain current to be added to a current to be boosted at the startup; and
after the startup of the output voltage, decrease the drain current so as to decrease power consumption of the linear power source,
wherein a conductivity of the output transistor at the startup increases by means of the drain current which flows in maximum even if a gate-source voltage of the depletion type NMOSFET is zero, and
wherein the conductivity of the output transistor decreases by means of a decrease of the drain current after the startup as the output voltage rises.

2. The linear power source of claim 1, wherein the depletion type NMOSFET is further configured to add the drain current to a driving current of the driver.

3. The linear power source of claim 2, wherein the depletion type NMOSFET has a drain connected to an output terminal of the driver, a source connected to the output terminal of the output voltage, and a gate connected to an application terminal of a constant voltage.

4. The linear power source of claim 3, wherein the constant voltage is set to a voltage value at which the gate-source voltage of the depletion type NMOSFET is equal to or greater than an on-threshold voltage when a rise of the output voltage starts.

5. The linear power source of claim 4, wherein the constant voltage is a ground voltage.

6. The linear power source of claim 4, wherein the constant voltage is a positive voltage.

7. The linear power source of claim 6, wherein the positive voltage is a divided voltage generated by dividing the output voltage.

8. The linear power source of claim 1, wherein the drain current becomes a zero value before the output voltage reaches a target value.

9. The linear power source of claim 1, wherein the drain current continues to flow after the output voltage reaches a target value.

10. A linear power source, comprising:
- an output transistor connected between an input terminal of an input voltage and an output terminal of an output voltage;
- a driver configured to drive the output transistor so that the output voltage or a feedback voltage corresponding to the output voltage matches a predetermined reference voltage; and
- a depletion type NMOSFET configured to:
  - at startup of the output voltage, generate a drain current to be directed through the output terminal of the output voltage; and
  - after the startup of the output voltage, decrease the drain current so as to decrease power consumption of the linear power source,
- wherein the output voltage at the startup increases by means of the drain current which flows in maximum even if a gate-source voltage of the depletion type NMOSFET is zero, and
- wherein the drain current to be directed through the output terminal of the output voltage decreases after the startup as the output voltage rises.

* * * * *